United States Patent [19]

Birkmire et al.

[11] Patent Number: 5,674,555
[45] Date of Patent: Oct. 7, 1997

[54] PROCESS FOR PREPARING GROUP IB-IIIA-VIA SEMICONDUCTING FILMS

[75] Inventors: Robert W. Birkmire, Churchville, Md.; Jerold M. Schultz, Newark, Del.; Matheswaran Marudachalam, Newark, Del.; Habib Hichri, Newark, Del.

[73] Assignee: University of Delaware, Newark, Del.

[21] Appl. No.: 564,957

[22] Filed: Nov. 30, 1995

[51] Int. Cl.⁶ .................................................. H01L 31/18
[52] U.S. Cl. .................... 427/76; 427/74; 437/5; 437/234; 437/247; 136/264; 136/265
[58] Field of Search ................... 427/74, 76; 437/5, 437/234, 247; 136/264, 265

[56] References Cited

U.S. PATENT DOCUMENTS

| | | | |
|---|---|---|---|
| 4,915,745 | 4/1990 | Pollock et al. | 136/265 |
| 5,028,274 | 7/1991 | Basol et al. | 136/264 |
| 5,356,839 | 10/1994 | Tuttle et al. | 437/225 |
| 5,436,204 | 7/1995 | Albin et al. | 437/225 |

FOREIGN PATENT DOCUMENTS 0 318 315 B1  2/1994  European Pat. Off. .......... 437/5

OTHER PUBLICATIONS

Marudachalam et al., "Characterization of Cu–In–Ga Precursors Used to Form Cu(In,Ga)Se$_2$ Films," WPEC (Dec. 1994), 234–237.

Marudachalam et al., "Preparation of Homogenous Cu(In-Ga)Se$_2$ Films by Selenization of Metal Precursors in H$_2$Se Atmosphere," Appl. Phys. Lett. (Dec. 1995), 67:3978–3980.

*Primary Examiner*—Aaron Weisstuch
*Attorney, Agent, or Firm*—Flehr Hohbach Test Albritton & Herbert LLP

[57] ABSTRACT

Methods are provided for the production of supported monophasic group I–III–VI semiconductor films. In the subject methods, a substrate is coated with group I and III elements and then contacted with a reactive group VI element containing atmosphere under conditions sufficient to produce a substrate coated with a composite of at least two different group I–III–IV alloys. The resultant composite coated substrate is then annealed in an inert atmosphere under conditions sufficient to convert the composite coating to a monophasic group I–III–VI semiconductor film. The resultant supported semiconductor films find use in photovoltaic applications, particularly as absorber layers in solar cells.

11 Claims, 2 Drawing Sheets

PROCESS FOR PREPARING GROUP IB-IIIA-VIA SEMICONDUCTING FILMS

ACKNOWLEDGMENT OF GOVERNMENT RIGHTS

This invention was made with Government support under subcontract no. XAV-3-13170-01 awarded by the National Renewable Energy Laboratory under contract no. DE-AC36-83CH10093 awarded by the Department of Energy. The Government has certain rights in this invention.

INTRODUCTION

1. Field of the Invention

The field of this invention is group I–III–VI semiconductor films.

2. Background

Semiconductor alloy films of group I–III–VI elements are the subject of considerable interest in the semiconductor field, particularly as to their utility as absorber layers in photovoltaic devices, such as solar cells. Group I–III–VI semiconductor films, such as $CuInSe_2$ and related compounds with high bandgaps, are potential candidates for absorber layers in thin film photovoltaic devices because of their high efficiency in convening solar energy to electrical energy.

Of particular interest are group I–III–VI semiconductor films comprising gallium in combination with another group III element, since gallium content in such films is associated with higher open circuit voltages and reduced short circuit currents. Efficiencies exceeding 16% have been reported for cells based on $Cu(InGa)Se_2$.

Despite the interest in group I–III–VI semiconductors films that comprise gallium, methods of preparing such films have not been perfected, particularly methods which are capable of being scaled up for industrial application. To date, the most successful methods for preparing such films are: (a) multi-source elemental evaporation to produce a thin semiconductor alloy film and (b) selenizafion of thin film metallic precursors in a Se containing atmosphere. While the former method, due to its versatility and good control of the film growth, has been the method of choice for basic research, selenization may be more appropriate for larger scale industrial production. However, with selenization, problems have been encountered, which include poor adhesion of the resultant film to the support due to reaction of Se with the molybdenum back contact during annealing, lack of homogeneity of the resultant film, and the like.

Thus, there is interest in the development of improved methods of preparing monophasic group I–III–VI alloy semiconductor films, particularly $CuIn_{1-x}Ga_xSe_2$ alloys, where the process is amenable to scale up, provides for semiconductor films that exhibit homogeneity and good adhesion to the underlying substrate, and where reaction between the Se and molybdenum back contact does not occur.

RELEVANT LITERATURE

Patents of interest describing the production of group I–III–VI semiconductor films include: U.S. Pat. Nos. 5,436,204; 5,356839 and 4,915,745; as well as granted European Pat. No. 0 318 315 B1.

SUMMARY OF THE INVENTION

Methods for preparing supported group I–III–VI semiconductor films are provided. In the subject methods, a substrate is coated with group I and III elements and then heated in the presence of a group VI element containing atmosphere under conditions sufficient to produce a supported composite layer of at least two group I–III–VI alloys. The resultant supported composite layer is then annealed in an inert atmosphere under conditions sufficient to convert the composite layer into a monophasic alloy film. The resultant supported group I–III–VI semiconductor film is suitable for use in photovoltaic applications.

DESCRIPTION OF THE SPECIFIC EMBODIMENTS

Figure 1:
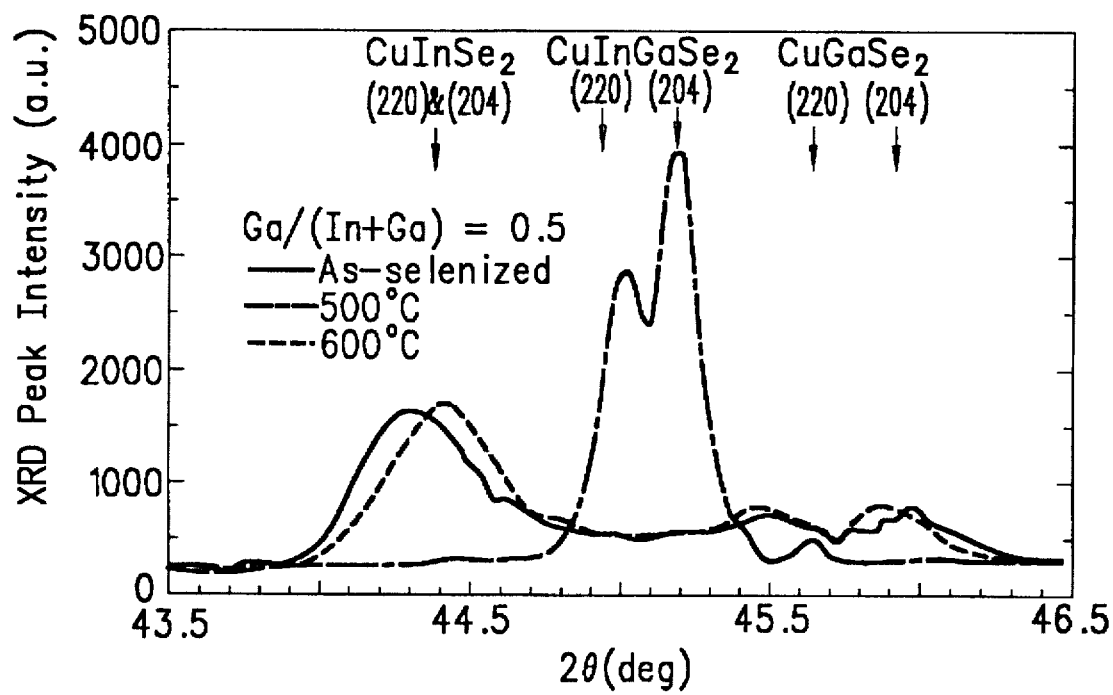
FIG. 1 provides an X-ray diffraction spectra of (220) and (204) reflections of as-selenized (device no. 89302) and annealed (device nos. 89303 & 89309) absorber $Cu(InGa)Se_2$ films with a $Ga/(Ga+In)≈0.5$.

Methods are provided for the production of monophasic group I–III–VI alloy semiconductor films. In the subject methods, a substrate is coated with group I and III elements and then heated in the presence of a group VI element containing atmosphere under conditions sufficient to produce a substrate coated with a composite layer of at least two group I–III–VI alloys. The composite coated substrate is then annealed in an inert atmosphere under conditions sufficient to produce a supported monophasic group I–III–VI alloy film. The resultant semiconductor films, having modified bandgap and high optical absorption efficiency, are particularly suited for use in photovoltaic applications, e.g. as absorber layers in solar cells.

The first step of the subject process is to coat a substrate with group I and group III elements. Any convenient substrate capable of serving as a support for a semiconductor film produced according to the subject invention may be employed. The substrate should be inert under the conditions in which it is employed as a support for the semiconductor film, such that the substrate does not react with the supported film or modulate the semiconductor properties of the film. The substrate will be of sufficient thickness to provide mechanical support to the film, and will usually range in thickness from about 0.025 to 5.0 mm, usually 1.0 to 5.0 mm, more usually from about 1.0 to 3.0 mm. The shape of the substrate is not critical to the invention, the particular substrate shape being chosen in view of the intended use of the semiconductor film supported thereon. Suitable substrates include glass, metal foils, high temperature plastics, ceramic, silicon, and the like.

The substrate may be coated with a metal layer which enhances the adhesion of the semiconductor film to the underlying substrate. The metal layer may also serve as an electrical contact layer in a photovoltaic cell in which the supported semiconductor film is incorporated. The metal layer will comprise at least one metal layer, and may comprise a first thinner layer and a second, thicker layer. In the latter case, the first, thinner layer provides for further improved adhesion of the semiconductor film. The thickness of the metal layer will generally range from 0.2 to 2.5 µm, usually from about 0.5 to 2.0 µm, and more usually from about 1.0 to 1.5 µm. Where the metal layer comprises a first and second layer, the first layer (adjacent to the support) will generally be from about 0.01 to 0.1 µm, usually from about 0.01 to 0.05 µm, where the ratio of thicknesses of first to second layers will range from 0.005 to 0.5. The metal layer(s) may be any one of chromium, molybdenum, tungsten, tantalum, titanium and the like, where molybdenum is preferred. Where the metal layer employed actually comprises two layers, the first, thinner layer will preferably be chromium while the second, thicker layer will be molybdenum. In some instances, it may be convenient to have the metal layer also serve as the mechanical support substrate, thereby replacing the substrate. In such cases the metal layer will have a thickness ranging from 0.025 to 1 mm, usually 0.1 to 1.0 mm, more usually from about 0.05 to 0.08 mm. The substrate may be coated with the group I and III elements using any convenient elemental deposition means. These means include electrodeposition, sputtering and evaporation, and the like. A preferred means of depositing the elemental layers onto the substrate is DC magnetron sputtering, as described in U.S. Pat. No. 4,465,575, the disclosure of which is herein incorporated by reference. Although the various elemental layers are described below as being deposited in a particular sequence, the deposition or coating sequence may be altered or the elements may be deposited at substantially the same time, where simultaneous deposition of the elemental layers will result in an initial elemental mixture layer.

A sufficient amount of group I element will be deposited onto the metal coated substrate to provide a film having the desired semiconductor properties and thickness. Generally, the thickness of the deposited group I layer will range from about 60 nm to 1.2 µm, more usually from about 175 nm to 300 nm. Group I elements which find use will preferably be group Ib elements, and include copper, silver and gold. Preferably, the group I element will be copper.

Also deposited onto the metal substrate will be at least one group III element, preferably at least one group IIIa element, more preferably two group IIIa elements, where at least one of the group IIIa elements will be gallium. The thickness of the group IIIa elements will depend on the thickness of the group I element and on the ratio of (Ca/Group IIIa elements). Group III elements of interest, in addition to gallium, include the group IIIa elements indium, aluminum, and thallium. Preferably gallium will be deposited in combination with an additional group IIIa element, where the additional group IIIa element is preferably indium. The amount of gallium and additional group IIIa element (Y) which is deposited or coated onto the surface of the substrate will be sufficient to provide a molar ratio of Ga/(Ga+Y) which ranges from 0.05 to 0.9, usually from about 0.1 to 0.8, more usually from about 0.25 to 0.75. The total amount of group III elements deposited on the substrate surface will be sufficient to provide a molar ratio of group Ib to group III elements, e.g. Cu/(Ga+In), which ranges from about 0.7 to 1.0, usually from 0.8 to 1.0, more usually being about 0.9.

The next step in the subject process is to heat the coated substrate in the presence of a group VI element containing atmosphere under conditions sufficient to convert the elemental coating to a composite coating of at least two group I–III–VI alloys. The group VI element containing atmosphere may comprise one or more group VI elements, but will usually comprise one group VI element. Group VI elements of interest include sulfur, selenium and tellurium, and will preferably be selenium. The group VI element containing atmosphere may comprise the group VI element in elemental form or in a reactive compound, preferably a hydride of a group VI element, where the reactivity of the compound is sufficient to produce the multiphasic composite coating. In addition to the group VI element or reactive group VI element comprising compound, the reactive group VI element atmosphere may also comprise additional constituents, such as nitrogen (N), helium (He), Argon (Ar), $O_2$, and the like. The molar percentage of the group VI element containing compound in the reactive mixture will range from about 0.2% to 15%, usually from about 0.3% to 1.0%.

The conditions under which the coated substrate is contacted with the reactive atmosphere will be sufficient to convert the deposited elemental layers into a composite of at least two group I–III–VI alloys. Generally, the temperature will range from about 300° to 600° C., usually from about 400° to 450° C. Contact between the substrate and the atmosphere will be maintained for a period of time ranging from about 10 to 120 min, usually from about 30 to 100 min, more usually from about 80 to 100 min.

The next step in the subject process is to anneal the resultant composite coated substrate in an inert atmosphere under conditions sufficient to convert the composite alloy layer or coating into a monophasic semiconductor film. Inert atmospheres which find use in this step of the subject invention include nitrogen, argon, and the like, with argon being the preferred atmosphere. The temperature of this annealing step will range from about 500° to 650° C., usually from about 575° to 625° C. Annealing will last for a period of time from about 60 to 120 min, usually from about 75 to 105 min.

Because conversion of the composite layer to a monophasic layer during the annealing step can result in a decrease in the group VI element content of the monophasic layer as compared to the composite layer, the resultant monophasic semiconductor film may optionally be subjected to a group VI element reintroduction step. In this optional group VI element reintroduction step, the resultant supported semiconductor film will be contacted with a reactive group VI element containing atmosphere under conditions sufficient to increase the group VI element content of the film. Conditions sufficient to increase the group VI element content of film include maintaining the supported film the reactive group VI element atmosphere at a temperature ranging from about from about 300° to 600° C., usually from about 400° to 450° C., for a period of time ranging from about 5 to 30 min, usually from about 10 to 15 min.

The resultant supported group I–III–VI semiconductor films, which will usually be group Ib-Ga-IIIa-VI films, more usually Cu-Ga-In-$Se_2$ films, will be homogeneous monophasic alloys ranging in thickness from about 0.5 to 10 µm, usually from about 1.25 to about 2.75 µm, more usually from about 1.5 to 2.5 µm. Where the semiconductor films are monophasic alloys of Cu, Ca, In, and Se, the subject films may be described by the formula:

$$CuIn_{1-x}Ga_xSe_2$$

where x is at least about 0.1, usually at least about 0.2 and may be as high as 0.9, but will usually not exceed 0.8, and will more usually not exceed 0.75.

The resultant semiconductor films find use in photovoltaic applications, where they exhibit a open circuit ($V_{oc}$) ranging from about 0.4 to 0.8 V, and a short circuit current ($J_{sc}$)

ranging from about 20 to 45 mA. As such, the semiconductor films of the subject invention exhibit high efficiency, and find use in a variety of photovoltaic devices, including the devices described in U.S. Pat. No. 4,915,745, the disclosure of which is incorporated herein by reference.

The following examples are offered by way of illustration and not by way of limitation.

EXPERIMENTAL

Homogeneous single phase $Cu(InGa)Se_2$ films with Ga/(In+Ga) molar ratios ranging from 0.25 to 0.75 were prepared and compared with layered, multi-phase $CuInSe_2$/$CuGaSe_2$ films.

To prepare the single phase $Cu(InGa)Se_2$ films, metal precursor films were deposited by DC magnetron sputtering in the sequence Cu-Ga-In at room temperature onto the surface of Mo coated soda lime glass substrates. The Cu thickness was chosen to be 250 nm and the thicknesses of Ga and In layers were adjusted to yield a Cu/(In+Ga) ratio of approximately 0.9. Precursor films with Ga/(Ga+In) ratios of 0, 0.25, 0.5, 0.75, and 1.0 were prepared. The temperature of precursor films was ramped up to the selenization temperature over a period of 10 min, where the selenization temperature was 450° C. for precursor films comprising Ga and 410° C. for films lacking Ga. The films were selenized in a flowing reactive $H_2Se/Ar/O_2$ mixture for 90 minutes.

The films were then annealed 60 minutes in-situ in an inert Ar atmosphere, with one set of films being annealed at 500° C and the other set at 600° C. Annealing was followed by a second exposure to the reactive gas mixture containing $H_2Se$ to compensate a possible Se loss at the film surface due to the annealing conditions. The structure of the resultant semiconductor absorber layers was examined by X-ray diffraction (XRD). The absorber layer composition was determined by energy dispersive X-ray spectroscopy (EDS) and Auger depth profile analysis.

Figure 2:
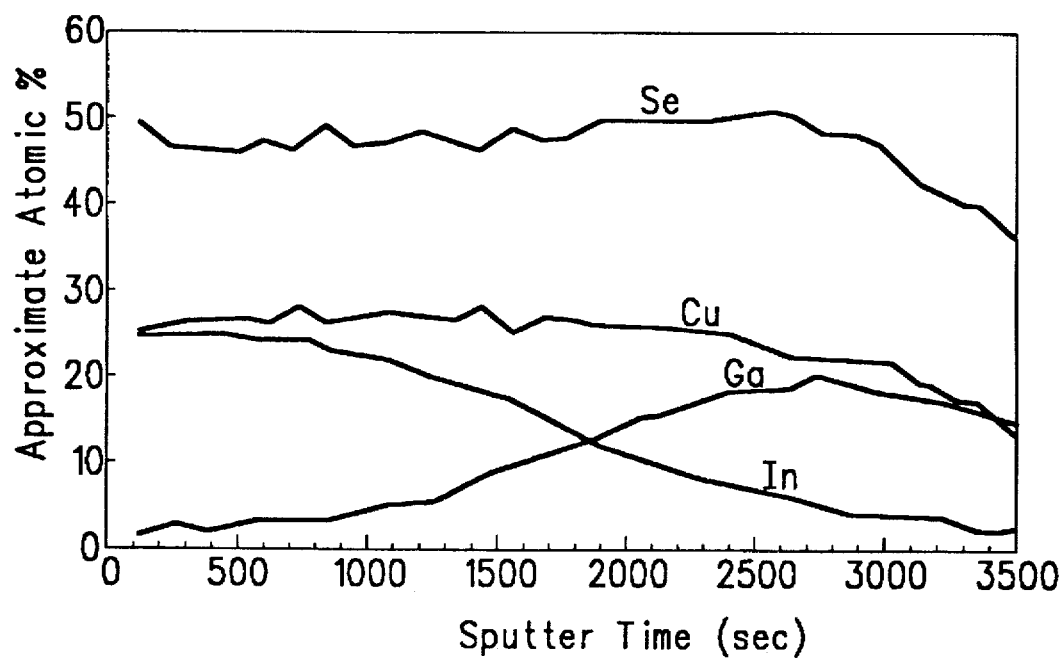
FIG. 2 provides an Auger depth profile of an as-selenized $Cu(InGa)Se_2$ film with a $Ga/(Ga+In)≈0.5$ (89302).

Selenization of the Cu-In and Cu-Ga precursor films resulted in single phase $CuInSe_2$ and $CuGaSe_2$ respectively. However, the selenization of the Cu-Ga-In precursor films resulted in films containing both $CuInSe_2$ and $CuGaSe_2$ phases, with little intermixing. The X-ray spectrum of the (220) and (204) reflections from the film with Ga/(In+Ga) ≈0.5 is shown in FIG. 1. The "as-selenized film," i.e. the control films which were not subjected to a subsequent annealing step following selenization, showed distinct peaks corresponding to phases close to $CuInSe_2$ and $CuGaSe_2$. Even though $CuInSe_2$ and $CuGaSe_2$ are miscible at all concentrations, there was little $Cu(InGa)Se_2$ evident in the spectrum. The Auger depth profile of this film, shown in FIG. 2, indicates that the film had a layered structure with $CuGaSe_2$ near the back and $CuInSe_2$ at the surface.

Figure 3:
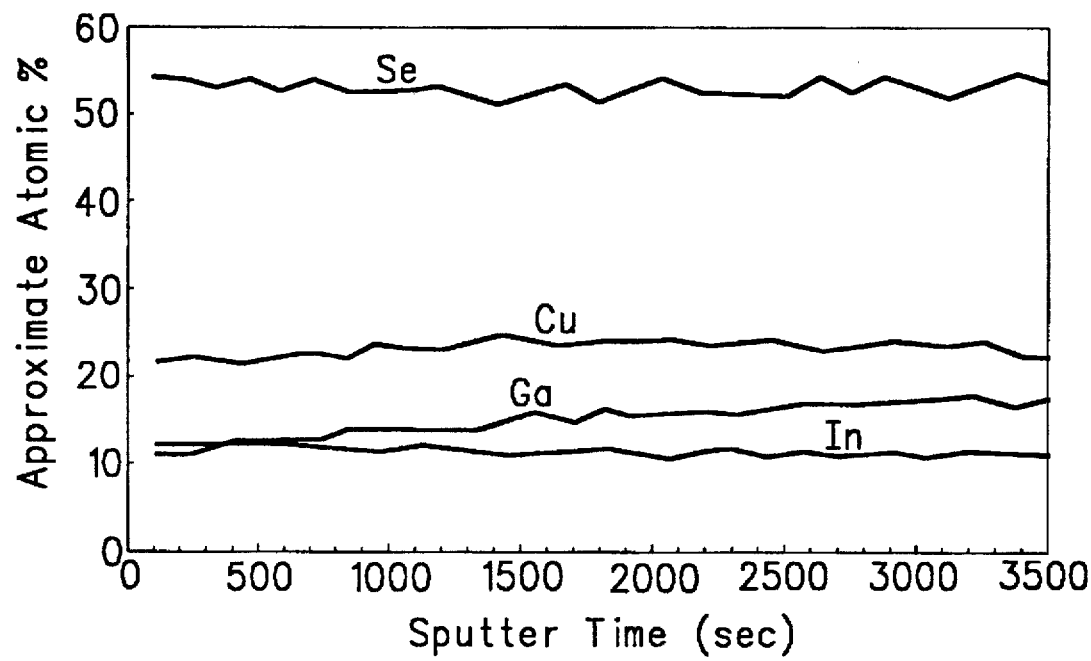
FIG. 3 provides an Auger depth profile of an annealed (60 min., 600° C. in Ar) $Cu(InGa)Se_2$ film with a $Ga/(Ga+In)≈0.5$ (89309).

XRD spectra of precursor films subjected to an in-situ Ar atmosphere annealing step at 500° and 600° C. following selenization are also shown in FIG. 1. While the precursor films still retained the two phase structure of the as-selenized film following annealing at 500° C., annealing the precursor films at 600° C. converted the films to single- or monophasic $Cu(InGa)Se_2$ film. Analysis of a 600° C. annealed film by Auger depth profile, see FIG. 3, confirmed that the Ga and In are more homogeneously distributed throughout the resultant film.

Similar results were observed for the films with a molar Ga/(In+Ga) ratio≈0.25. However, for films with a Ga/(In+Ga)≈0.75, the precursor film was converted to single phase after the 500° C anneal. Since the homogenization occurred at a lower temperature it is assumed that inter-diffusion of In and Ga is faster in films with greater Ga content.

To study the photovoltaic properties of the resultant films, heterojunctions were formed by chemical bath deposition of a 50 nm thick CdS buffer layer and a double layer (high resistivity/low resistivity) of RF sputtered ZnO:Al. Ni front contacts were evaporated through a shadow mask. No anti-reflection coatings were used.

The resultant solar cells were characterized by current-voltage and spectral response measurements. Estimations of the parameters of minority carrier transport and the bandgap of the absorber were derived from the long wavelength cut-off of the spectral response. (Capacitance was measured with a 100 kHz /50 mV excitation under ambient light).

The results observed for solar cells made from prepared films with the different Ga contents and annealing conditions are listed in Table 1. In Table 1, the absorber layer of Device #89302 is representative of a two phase structure obtained in the as-selenized condition, i.e., without a post-selenization heat treatment. The X-ray diffraction (XRD) scan, spectral response measurement and Auger depth profile confirm a layered two phase structure (Mo/CGS/CIS). The absorber layer of Device No. #89303 was selenized and heat treated at 500° C. for 60 minutes in an Argon atmosphere. This film does not show any marked difference from the film in the as-selenized selenized condition as shown in the XRD and spectral response measurements. The absorber film of Device #89309 was subjected to a 600° C. heat treatment for 60 minutes in an Ar atmosphere which resulted in a single phase CIGS as shown in XRD, spectral response and Auger depth profile measurements.

TABLE 1

| Device # | Ga/(Ga + In) | Anneal (°C.) | Structure | Voc (V) | Jsc (mA) | FF (%) | EFF (%) |
|---|---|---|---|---|---|---|---|
| 89292-2 | 0 | — | CIS | 0.44 | 39 | 66 | 11.2 |
| 89308-2 | 0.25 | — | CIS/CGS | 0.46 | 39 | 58 | 10.4 |
| 89303-3 | 0.25 | 500 | CIS/CGS | 0.45 | 38 | 68 | 11.5 |
| 89317-3 | 0.25 | 600 | CIGS | 0.56 | 34 | 67 | 12.9 |
| 89302-3 | 0.50 | — | CIS/CGS | 0.53 | 38 | 64 | 13.1 |
| 89303-2 | 0.50 | 500 | CIS/CGS | 0.54 | 35 | 66 | 12.5 |
| 89309-1 | 0.50 | 600 | CIGS | 0.59 | 30 | 60 | 10.5 |
| 89317-1 | 0.75 | 600 | CIGS | 0.63 | 22 | 46 | 6.4 |

Data table and description
The table lists the device nos., absorber structure and annealing details.

Figure 4:
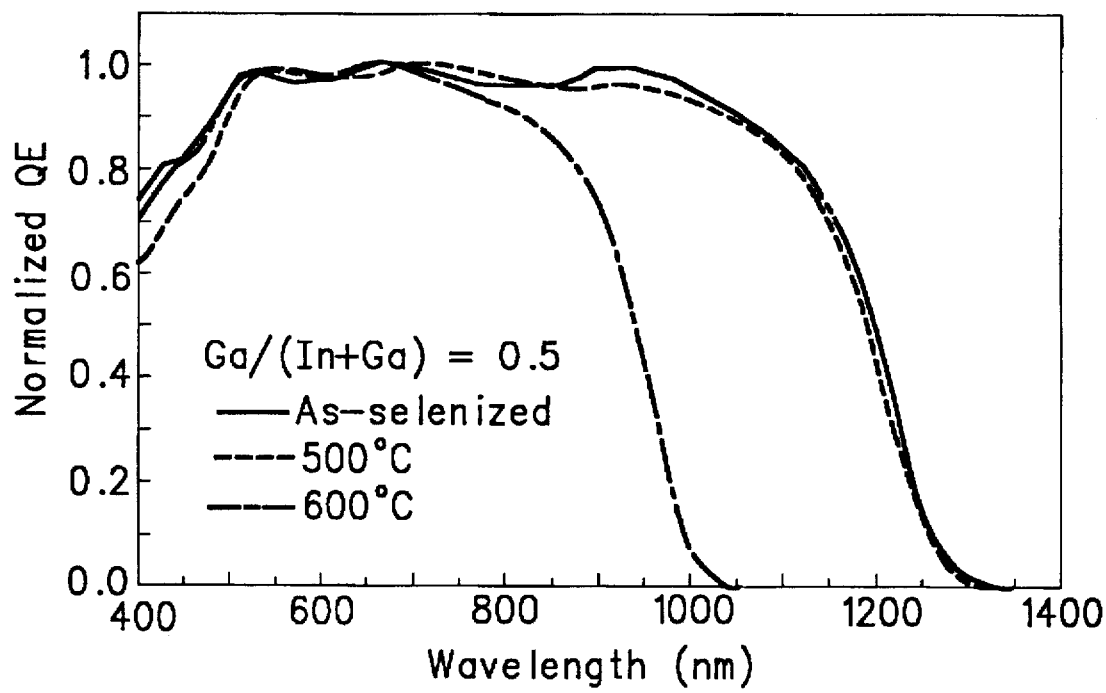
FIG. 4 provides the spectral response curve for an as-selenized absorber (89302), an absorber heat treated at 500° C. (89303) and an absorber heat treated at 600° C. (89309), where the absorbers were $Cu(InGa)Se_2$ films with a $Ga/(Ga+In)≈0.5$.

Spectral response plots for the as-selenized and annealed films with Ga/(In+Ga)≈0.5 are shown in FIG. 4. For the as-selenized films, the open circuit voltage ($V_{oc}$) and long wavelength cut-off of the spectral response of the as-selenized multi-phase absorbers are similar to $CuInSe_2$ cells. The photovoltaic response is controlled by the more In-rich, lower bandgap phase close to the heterojunction.

The second phase is separated from the active layer of the device and does not deteriorate the cell performance. For annealed, single-phase films, increased $V_{oc}$ and a shift in the spectral response cut-off consistent with the expected molar Ga/(In+Ga) ratio for these films is observed. Evaluation of the spectral response and capacitance for all devices suggests a narrow field zone and a good diffusion length of 0.6–1/μm. The long wavelength spectral response can be described with good accuracy by assuming a constant, direct bandgap, as there is no indication for a graded bandgap.

From the above results it was concluded that absorber films prepared by selenization of Cu-Ga-In precursor layers with $H_2Se$ followed by an in-situ annealing step in an inert Ar atmosphere provide for homogenous, single- or monophasic semiconductor films, even when the precursor film comprises a high Ga-content. Material and device measurements show that these films contain the same molar Ga/(In +Ga) ratio composition as the starting precursors.

The supported semiconductor films produced by the subject process have a high open current voltage and low short circuit current. Furthermore, the subject films do not suffer from poor adhesion to the underlying substrate.

It is evident from the above results and discussion that improved methods of preparing supported group I–III–VI semiconductor films suitable for use in photovoltaic applications are provided. The subject methods provide for films with high Ga contents suitable for high efficiency solar cells. The films produced by the subject process do not suffer from poor adhesion to the substrate because, in the subject process, reaction of the substrate metal coating with the group VI element during annealing does not occur, since the annealing step is carried out in an inert atmosphere.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of light of the teachings of this invention that certain changes and modifications may be made thereto without departing from the spirit or scope of the appended claims.

What is claimed is:

1. A method for producing supported group Ib–IIIa–VIa semiconductor films, comprising the steps of:
   a) coating a substrate with group Ib and IIIa elements to produce a coated substrate;
   b) heating said coated substrate in the presence of a reactive group VIa element containing atmosphere under conditions sufficient to produce a composite coated substrate, wherein said composite comprises at least two different group Ib–IIIa–VIa alloys;
   c) annealing said composite coated substrate in an inert atmosphere to convert said composite coating to a monophasic group Ib–III–VIa semiconductor film;
   whereby a supported group Ib–IIIa–VIa semiconductor film is produced.

2. The method according to claim 1, wherein said group IIIa element comprises Ga in combination with an additional group IIIa element.

3. The method according to claim 1, wherein said method further comprises contacting said supported semiconductor film with a reactive group VIa element containing atmosphere under conditions sufficient to increase the group VIa element content of said supported semiconductor film.

4. A method for producing a group Ib-Ga-IIIa-Se semiconductor film, comprising the steps of:
   a) coating a substrate with Ga, a group Ib, and an additional group IIIa element to produce a coated substrate;
   b) heating said coated substrate in the presence of a selenium containing atmosphere at a temperature ranging from about 400° to 450° C. for about 80 to 100 min to produce a composite coated substrate, wherein said composite comprises at least two different group Ib-IIIa-Se alloys;
   c) annealing said composite coated substrate in an inert atmosphere at a temperature ranging from about 500° to 600° C. for about 60 to 120 min to produce a monophasic group Ib-Ga-IIIa-Se semiconductor film;
   whereby a supported group Ib-Ga-IIIa-Se semiconductor film is produced.

5. The method according to claim 4, wherein said method further comprises contacting said supported semiconductor film with a reactive selenium containing atmosphere under conditions sufficient to increase the selenium content of said supported semiconductor film.

6. The method according to claim 4, wherein said group Ib element is selected from the group consisting of Cu, Ag, and Au.

7. The method according to claim 4, wherein said additional group IIIa element is selected from the group consisting of In, Al, and Tl.

8. The method according to claim 4, wherein said Se containing atmosphere comprises at least one of H2Se and elemental Se.

9. A method for producing a supported $CuIn_{1-x}Ga_xSe_2$ semiconductor film, wherein x ranges from 0.1 to 0.9 comprising the steps of:
   a) coating a substrate with Cu, In, and Ga to produce a coated substrate;
   b) heating said coated substrate in the presence of a reactive selenium containing atmosphere at a temperature ranging from about 400°to 450° C. for about 80 to 100 min to produce a composite coated substrate, where said composite comprises $CuInSe_2$ and $CuGaSe_2$ alloys;
   c) annealing said composite coated substrate in an inert atmosphere at a temperature ranging from about 500° to 650° C. for about 60 to 120 min to produce a monophasie group $CuIn_{1-x}Ga_xSe_2$ layer;
   whereby a supported $CuIn_{1-x}Ga_xSe_2$ semiconductor film is produced.

10. The method according to claim 9 wherein said method further comprises contacting said supported semiconductor film with a reactive selenium containing atmosphere under conditions sufficient to increase the selenium content of said supported semiconductor film.

11. The method according to claim 10, wherein said Se containing atmosphere comprises at least one of $H_2Se$ and elemental Se.

* * * * *